(12) United States Patent
Yamaguchi

(10) Patent No.: US 6,677,215 B2
(45) Date of Patent: Jan. 13, 2004

(54) METHOD OF FABRICATING A DIODE PROTECTING A GATE ELECTRODE OF A FIELD EFFECT TRANSISTOR

(75) Inventor: Yasuo Yamaguchi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/309,022

(22) Filed: Dec. 4, 2002

(65) Prior Publication Data

US 2003/0224576 A1 Dec. 4, 2003

(30) Foreign Application Priority Data

May 31, 2002 (JP) .................................. 2002-159275

(51) Int. Cl.[7] ............................................ H01L 21/331
(52) U.S. Cl. ........................................ 438/369; 438/394
(58) Field of Search .................................. 438/241, 369, 438/372, 377, 394, 399, 242, 373

(56) References Cited

U.S. PATENT DOCUMENTS 6,509,225 B2 * 1/2003 Moriwaki et al.

FOREIGN PATENT DOCUMENTS

JP 01-168064 7/1989

* cited by examiner

Primary Examiner—Phuc T. Dang
(74) Attorney, Agent, or Firm—McDermott, Will & Emery

(57) ABSTRACT

There is provided a method including the steps of: forming spaced gate patterns on a main surface of a semiconductor substrate; forming sidewall films on the gate patterns, respectively, at their respective sidewalls facing each other; and, with the gate patterns and the sidewall films used as a mask, implanting a dopant in the semiconductor substrate to form a doped region. The doped region and a substrate region adjacent thereto together form a diode protecting a gate electrode of a field effect transistor. The doped region as a constituent of the diode can be minimized in size to be smaller than a limit of resolution.

5 Claims, 6 Drawing Sheets

METHOD OF FABRICATING A DIODE PROTECTING A GATE ELECTRODE OF A FIELD EFFECT TRANSISTOR

BACKGROUND OF THE INVENTION

1. Field of the Invention

The present invention relates generally to a method of fabricating a diode for protecting a gate electrode of a field effect transistor and particularly to a method of fabricating a diode for protecting a gate electrode of a metal oxide semiconductor (MOS) transistor produced using MOS transistor production technology.

2. Description of the Background Art

Recent semiconductor device fabrication processes include a large number of steps using a plasma. For example, etching, depositing an interlayer insulation film, and the like exclusively use a plasma to do so.

It is known that in such steps using a plasma a phenomenon referred to as an "antenna effect" is caused if an element (for example, an interconnection) involved in the step has previously been connected to a gate electrode of a field effect transistor. The antenna effect is a phenomenon that a large difference in potential is introduced between a gate electrode and a semiconductor transistor that are positioned with a gate insulation film posed therebetween.

The antenna effect can significantly affect a function of a field effect transistor. More specifically, if a difference in potential no less than prescribed is introduced between the gate electrode and the semiconductor substrate the gate insulation film's characteristics are impaired. If a further larger difference in potential is introduced and has reached a difference in potential that is no less than the gate insulation film's breakdown voltage, the gate insulation film would have an electrical breakdown. The degradation of characteristics of a gate insulation film and the breakdown thereof that are caused by a step using a plasma are generally referred to as a "plasma damage" and need to be addressed as a factor impairing a function as a semiconductor device.

For example, with reference to FIG. 10, an aluminum interconnection M2 is formed by reactive-ion etching, an etching step using a plasma. This etching step introduces an electric charge in aluminum interconnection M2. This electric charge changes a node potential through an aluminum interconnection M1 and a gate pattern D1 and introduces a large difference in potential between a gate electrode and a semiconductor substrate.

One approach to address the plasma damage is to connect a protection diode to the gate electrode. In this approach, as shown in an equivalent circuit as shown in FIG. 11, a protection diode 31 has an anode (A) connected to a gate electrode (G) of a MOS transistor 30 and a cathode (K) to a ground potential. Used as this diode is for example a diode having a Zener breakdown for differences in potential smaller than that for which the gate insulation film suffers the plasma damage.

The diode passing an electric current in a reverse direction for a difference in potential smaller than that for which the gate insulation film suffers the plasma damage that is connected as shown, releases an electric charge to the ground potential when a large difference in potential is introduced between the gate electrode and the semiconductor substrate. The gate insulation film can thus avoid the plasma damage.

The aforementioned protection diode is typically fabricated into a semiconductor device in which a field effect transistor is formed. The protection diode is by providing a main surface of the semiconductor substrate with a doped region different in conductivity than the semiconductor substrate and using the doped region and a substrate region to provide a pn junction. The diode's doped region thus provided is electrically connected to the gate electrode of the field effect transistor and the substrate region is electrically connected to a ground potential to allow the diode to function as a gate electrode protection diode.

One such protection diode thus configured is disclosed for example in Japanese Patent Laying-Open No. 1-168064. The protection diode disclosed in the publication has a doped region having its entire periphery surrounded by a gate pattern.

Preferably the protection diode is formed and connected to the gate electrode in a semiconductor device fabrication process at as early a step as possible so that in a subsequent step the plasma damage can be prevented and increased yields can be expected.

To form the protection diode, as described above, the diode's junction needs to be reduced in area so that parasitic capacitance can be reduced and the protection diode can thus operate rapidly and response performance can be improved.

Minimizing in area the junction of the protection diode formed by providing a doped region in a main surface of a semiconductor substrate, as described above, entails reducing in size the doped region in the semiconductor substrate, as seen in a plane. Since the doped region is determined in size by a limit of resolution of photolithography, it can hardly be minimized to be smaller in size than the limit. For example, the protection diode disclosed in the aforementioned publication has a doped region which can only be minimized in size to the limit of resolution of photolithography, defined by a gate pattern.

SUMMARY OF THE INVENTION

An object of the present invention is to provide a method of fabricating a protection diode of a field effect transistor that can form a doped region as a constituent of the diode in a size smaller than a limit of resolution of photolithography.

The present method provides a protection diode formed by a doped region electrically connected to a gate electrode of a field effect transistor, and a substrate region located adjacent to the doped region and electrically connected to a ground potential. To achieve the above object the present method includes the steps of:

forming first and second conductive layers on a main surface of the semiconductor substrate, the first and second conductive layers being spaced from each other;

forming first and second sidewall films adjacent to a sidewall of the first conductive layer opposite the second conductive layer and a sidewall of the second conductive layer opposite the first conductive layer, respectively; and with the first and second conductive layers and the first and second sidewall films used as a mask, implanting a dopant in the semiconductor substrate to form the doped region.

With the above process used to form a doped region, a sidewall film arranged adjacent to a sidewall of a conductive layer can serve as a mask when a dopant is implanted, and the doped region can be formed to have a size smaller than a limit of resolution of photolithography. This allows the protection diode's pn junction interface to be significantly smaller in area than conventional to reduce the diode's parasitic capacitance and provide enhanced response performance. Fabricating the protection diode in a semiconductor device fabrication process at as early a stage as possible and connecting the diode to a gate electrode of a field effect transistor, can prevent plasma damage in subsequent process steps and thus be expected to contribute to increased yields. Note that the first and second conductive layers can be either separate conductive layers formed independently or portions of a single conductive layer.

Preferably the present method further includes the step of forming a plurality of element isolating regions in a main surface of the semiconductor substrate to traverse the first and second conductive layers when the semiconductor substrate is seen in a plane, wherein the step of implanting includes using the first and second sidewall films and the element isolating region as a mask.

In the present method the step of forming the first and second conductive layers includes forming a conductive layer having an opening when the semiconductor substrate is seen in a plane and the step of forming the first and second sidewall films includes forming a sidewall film adjacent to a sidewall of the opening.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter the present invention in embodiments will be described with reference to the drawings.

FIRST EMBODIMENT

The present embodiment provides a protection diode using as first and second conductive layers a dummy gate formed simultaneously in the same step that forms a gate electrode of a MOS transistor formed in another region of the semiconductor substrate of interest.

Figure 1:
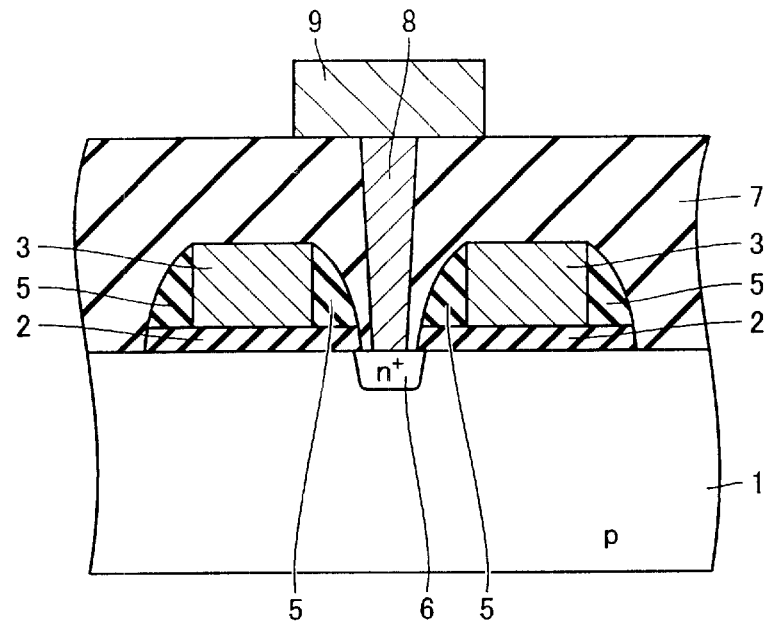
FIGS. 1 and 2 are a cross section and a top view, respectively, of a protection diode of the present invention in a first embodiment.
Figure 2:
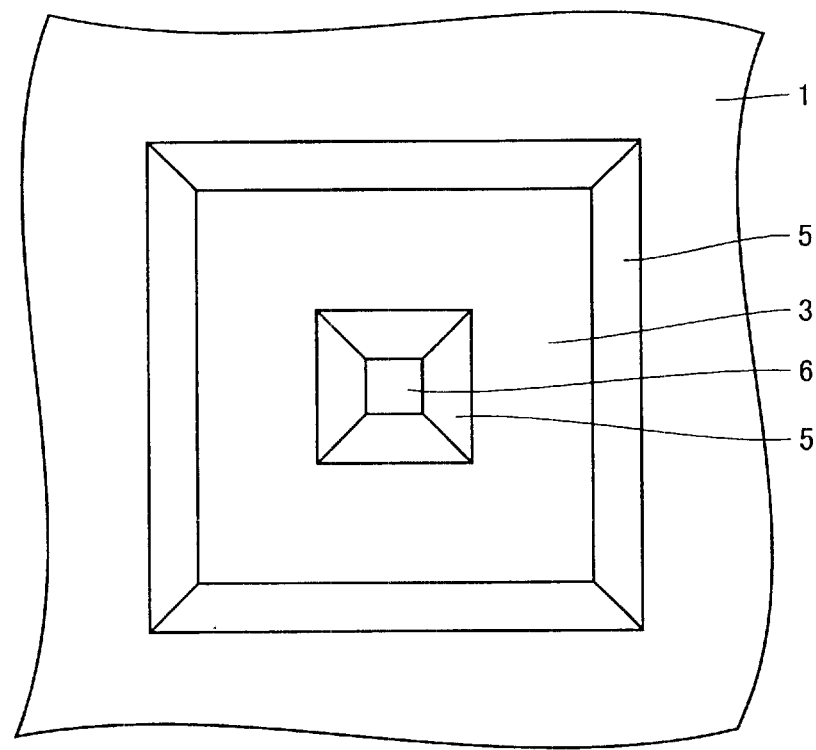
Figure 3:
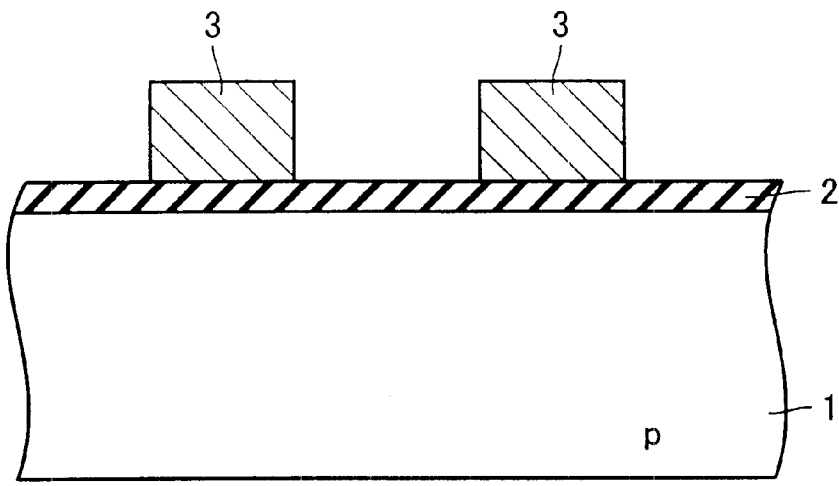
FIGS. 3–6 show process steps of a method of fabricating the protection diode of the present invention in the first embodiment.

Reference will initially be made to FIGS. 1 and 2 to describe a structure of the protection diode of the present embodiment. As shown in FIG. 1, a semiconductor substrate has a main surface underlying first and second conductive layers or a gate pattern 3 with a gate insulation film 2 posed therebetween. Gate pattern 3 is formed for example of polysilicon.

Gate patterns 3 has a sidewall adjacent to a sidewall film 5. Sidewall film 5 is an insulation film provided to form a source/drain region in a MOS transistor fabrication process in self-alignment and it is formed for example of silicon oxide film.

Gate pattern 3 on the main surface of semiconductor substrate 1, as described above, are spaced from each other and the two gate patterns 3 have their respective sidewalls opposite each other with sidewall film 5 adjacent thereto.

In the main surface of semiconductor substrate 1 between sidewall films 5 is formed a doped region 6 different in conductivity from the semiconductor substrate. In the figure a p semiconductor substrate is used and the doped region is of n type. Doped region 6 and a substrate region adjacent to doped regions 6 together form the protection diode.

On semiconductor substrate 1 an interlayer insulation film 7 is formed to cover the two gate patterns 3. Interlayer insulation film 7 is provided with a contact 8 to connect doped region 6 and an interconnection 9 together. Interconnection 9 is electrically connected to a gate electrode of a MOS transistor formed in another region of semiconductor substrate 1. Note that the substrate region of semiconductor substrate 1 is electrically connected to a ground potential.

In the present embodiment, as reference to FIG. 2, the two gate patterns 3 serving as the first and second conductive layers are a portion of an annular conductive layer, and the annular conductive layer has an inner side wall provided with sidewall film 5.

Reference will now be made to FIGS. 3 to 6 describe a method of fabricating the protection diode structured as described above. Initially, p semiconductor substrate 1 is prepared and on a main surface thereof gate insulation film 2 is provided. Furthermore, gate pattern 3 serving as the first and second conductive layers is provided on gate insulation film 2 through photolithography (see FIG. 3). Note that in the present embodiment gate pattern 3 is provided simultaneously in the same step that forms a gate pattern of a field effect transistor formed in another region of semiconductor substrate 1.

Figure 4:
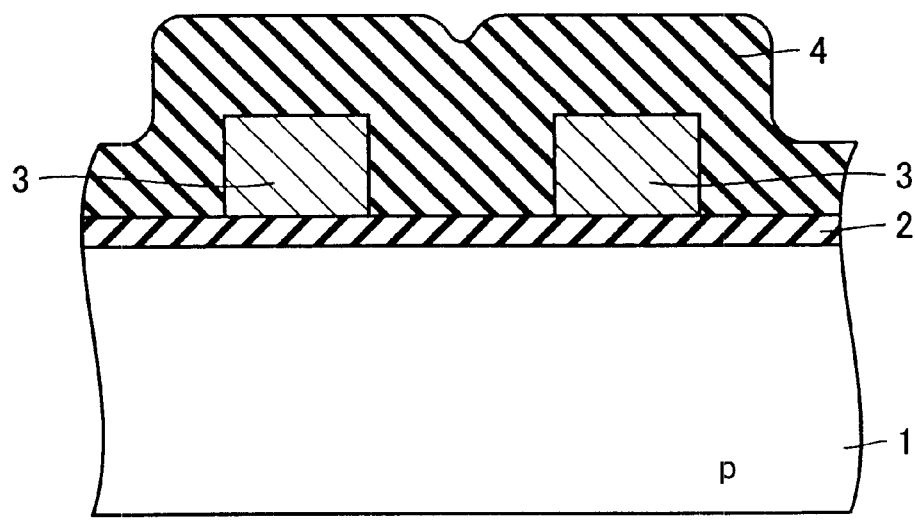
Figure 5:
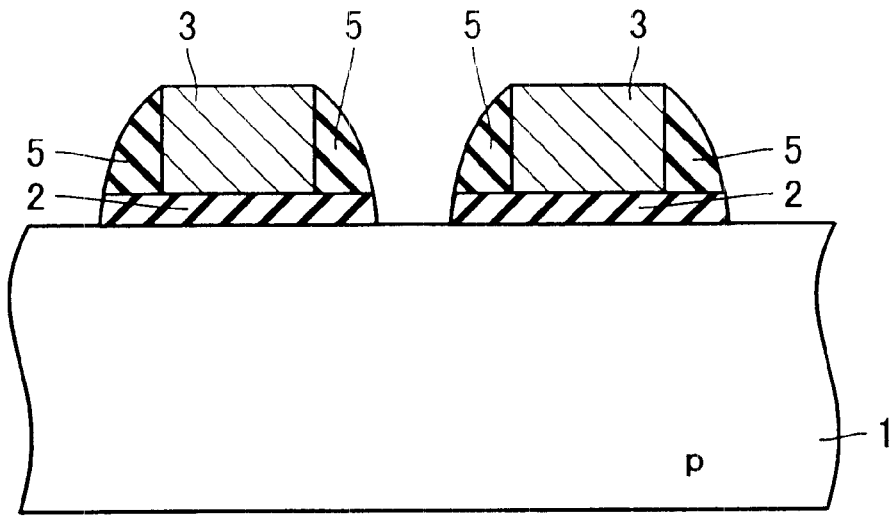

Then gate insulation film 2 and gate pattern 3 are covered by an oxide film 4 deposited on the entirety of the main surface of semiconductor substrate 1 (see FIG. 4). For example, oxide film 4 is provided by plasma chemical vapor deposition (plasma CVD). Subsequently, the intermediate product is anisotropically dry-etched and etched back to allow the oxide film to remain only on opposite sidewalls of gate pattern 3 (see FIG. 5). Note that it is etched back to expose the main surface of semiconductor substrate 1 between the two gate pattern 3. Gate pattern 3 thus has opposite sidewalls provided with sidewall film 5 and the two gate patterns 3 thus have their respective sidewalls opposite to each other with sidewall film 5 adjacent thereto. Note that in the present embodiment sidewall film 5 is formed simultaneously in the same process that forms a sidewall film of the field effect transistor formed in another region of semiconductor substrate 1.

Figure 6:
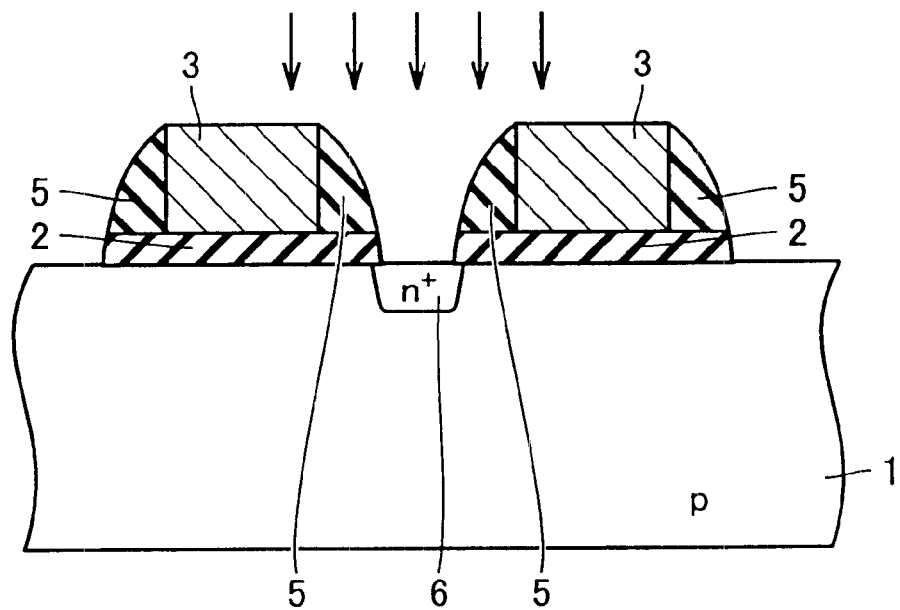

Sidewall film 5 formed through the above process steps is used as a mask to implant ions into semiconductor substrate 1 to provide doped region 6 different in conductivity from semiconductor substrate 1 only in the main surface of semiconductor substrate 1 that is located between sidewall films 5 (see FIG. 6).

Furthermore interlayer insulation film 7 is thereafter provided and contact 8 electrically extracting doped region 6 is formed and connected to interconnection 9 to complete the protection diode structured as shown in FIG. 1.

The present method can be used to form a diode for protection of a gate electrode of a field effect transistor to allow a doped region conventionally defined in size by a limit of resolution of photolithography to be reduced by a size corresponding to a sidewall film provided on a sidewall of a conductive layer. The protection diode can thus have a pn junction interface smaller in area than conventional and parasitic capacitance can be reduced. Consequently, the protection diode can operate more rapidly and be excellent in response performance. Furthermore, using a dummy gate as the conductive layer to form the protection diode allows the protection diode to have a junction minimized in area without complicating the fabrication process. As such, the fabrication cost does not increase.

In a semiconductor device with the present protection diode a region in which the protection diode is formed exists in a prescribed region of a main surface of a semiconductor substrate and a region in which a MOS transistor is formed is located in another region of the main surface of the semiconductor substrate. Hereinafter will be described a structure of a semiconductor device having the aforementioned protection diode.

Figure 7:
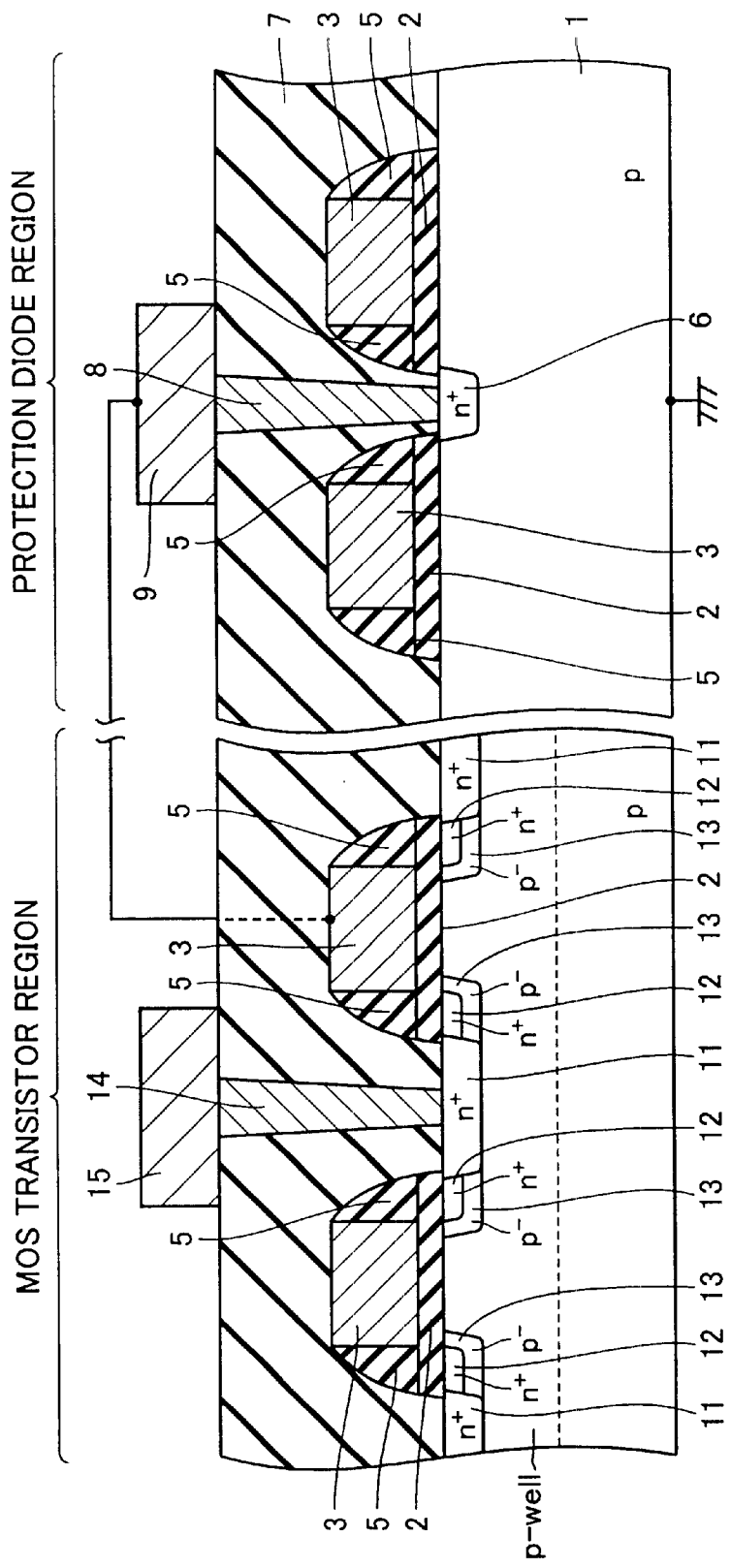
FIG. 7 is a cross section of a semiconductor device fabricated by the method of fabricating the protection diode of the present invention in the first embodiment.

With reference to FIG. 7, the protection diode has doped region 6 electrically connected via contact 8, interconnection 9 and the like to gate electrode 3 of a MOS transistor formed in another region of semiconductor substrate 1.

In the MOS transistor a channel region is provided in a main surface of semiconductor substrate 3 exactly under gate pattern 3 and the channel region is sandwiched by a source region and a drain region formed alternately. The source and drain regions are provided by ion implantation and formed by different types doped region to provide optimized electrical characteristics.

For the FIG. 7 MOS transistor, for example, semiconductor substrate 1 has a p well layer therein, a source/drain region 11 has an end provided with a source/drain extension region 12 and thereunder a pocket region 13 is further provided. However in the present embodiment the protection diode is not provided with these doped regions. This is because preferably they are eliminated to reduce the protection diode's junction in capacitance. Specifically, when ions are implanted for the MOS transistor the region in which the protection diode is formed is masked to prevent ion implantation therein. Note that only in source/drain implantation the region in which the protection diode is formed may be unmasked and when the MOS transistor's source/drain region is formed the protection diode's doped region may simultaneously be formed. The fabrication process can be shortened.

For the MOS transistor, ions can be implanted, by way of example, as follows: for NMOS, for example, a well is formed by introducing boron (B) with 140 keV and 250 keV in a dose of $1\times10^{13}$ cm$^{-2}$ and a channel is formed by introducing B with 20 keV in a dose of $2\times10^{12}$ cm$^{-2}$. Furthermore, a source/drain is formed by introducing arsenic (As) with 50 keV in a dose of $5\times10^{15}$ cm$^{-2}$. Furthermore, a source/drain extension is formed by introducing As with 20 keV in a dose of $1\times10^{15}$ cm$^{-2}$ and a pocket is formed by introducing B obliquely (at 45 degrees) with 20 keV in a dose of $1\times10^{13}$ cm$^{-2}$. Eliminating these ion implantations in the region in which the protection diode is formed allows the protection diode to operate at a dramatically increased speed.

Fabricating a semiconductor device with a protection diode thus configured can contribute to increased yields, eliminating impaired characteristics and breakdown of a gate insulation film of a MOS transistor that are attributed to the plasma damage caused for example in an interconnection step. In the present embodiment the protection diode has a pn junction interface smaller than conventional. As such, the protection diode can operate faster and hence in good response to a rapidly rising surge potential so that dramatically increased yields can be expected.

In the present embodiment desirably the gate patterns are spaced by a distance equal to the dimension corresponding to the limit of resolution of a laser beam used when the gate patterns are formed. This allows the protection diode to have a doped region formed smaller than the dimension by the sidewall. For example if a KrF laser beam is used the limit of resolution of a dot pattern such as squares and circles is approximately 0.4 μm. Accordingly, the gate patterns are spaced by approximately 0.4 μm to allow formation of a doped region more microfabricated than the limit of resolution.

SECOND EMBODIMENT

The present embodiment provides a protection diode substantially similar in structure to the first embodiment and also similarly fabricated. Accordingly, a top view of the protection diode and a cross section showing its fabrication process will not be repeated. Any portions shown in the figure that are similar to those described in the first embodiment are denoted by the same reference characters as the first embodiment.

Figure 8:
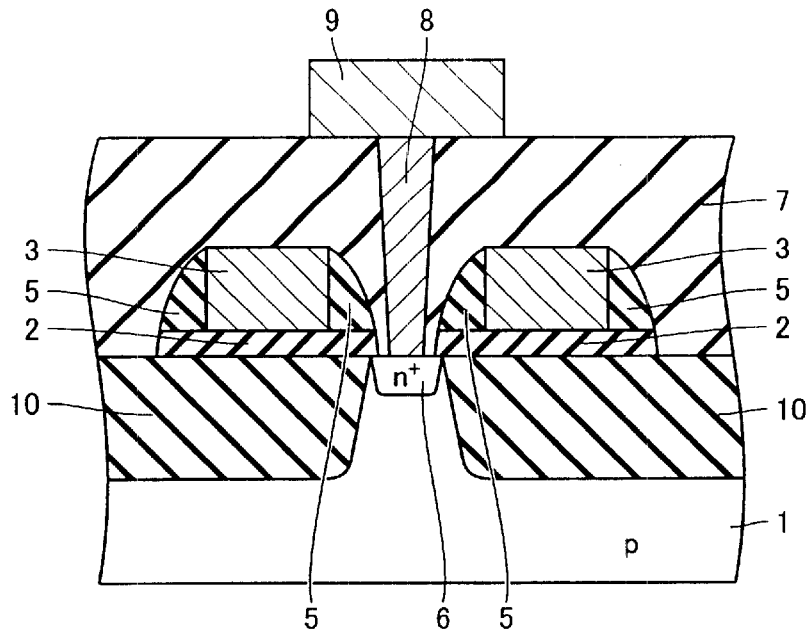
FIG. 8 is a cross section of the protection diode of the present invention in a second embodiment.

As shown in FIG. 8, for the protection diode of the present embodiment, in order to form doped region 6 an element isolating region 10 underlies gate pattern 3 formed on semiconductor substrate 1. Element isolating region 10 is formed in a main surface of semiconductor substrate 1 before a device is formed at semiconductor substrate 1, and it is well known for example in the form of a trench referred to as a shallow trench isolation (STI) and that formed through a process referred to as local oxidation of silicon (LOCOS). FIG. 8 shows the STI by way of example.

Arranging a gate pattern on an element isolating region, as described above, can achieve the effect of the first embodiment as well as allows the semiconductor substrate and the gate pattern to be more distant from each other so as to be more impervious to an effect of coupling. More specifically, series capacitive coupling can be provided and the doped region can experience a significantly reduced capacitance. Desirably, the gate patterns overlap the element isolating region when the semiconductor substrate is seen in a plane. However, if the patterns are slightly offset from the region or only one of the patterns overlaps the region, the aforementioned effect, although lower in level, can still be obtained.

THIRD EMBODIMENT

The present embodiment provides a protection diode similar in cross section to that of the first embodiment. The present embodiment shows by way of example that in addition to a sidewall film formed adjacent to a sidewall of a gate pattern that is used to define in size a doped region of a protection diode in the first embodiment an element isolating region formed in a typical MOS transistor fabrication process is also used to define the doped region of the protection diode in size.

Figure 9:
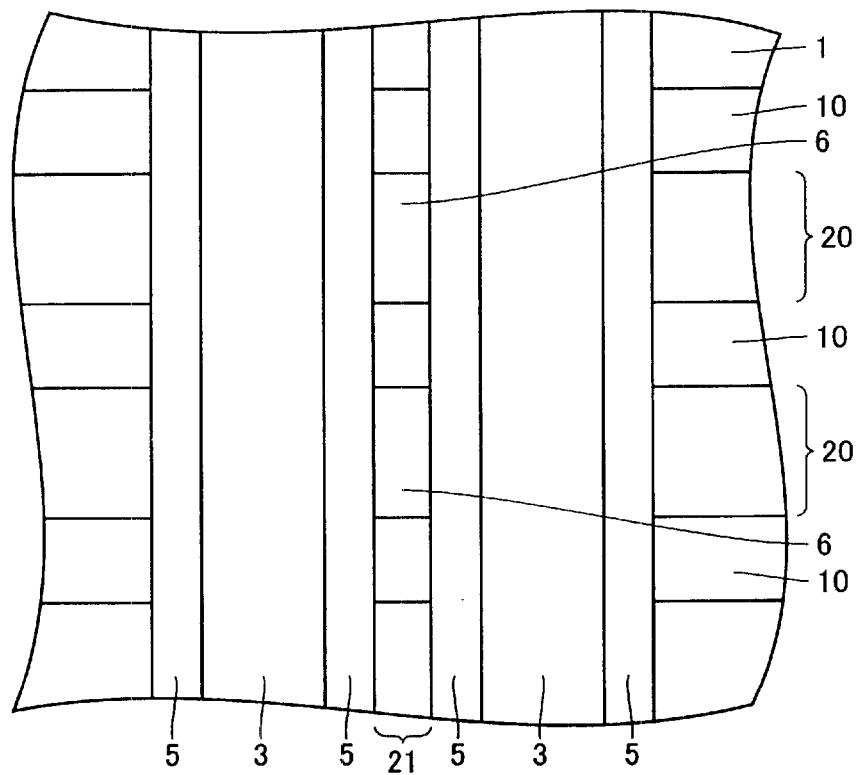
FIG. 9 is a top view of the protection diode of the present invention in a third embodiment.
Figure 10:
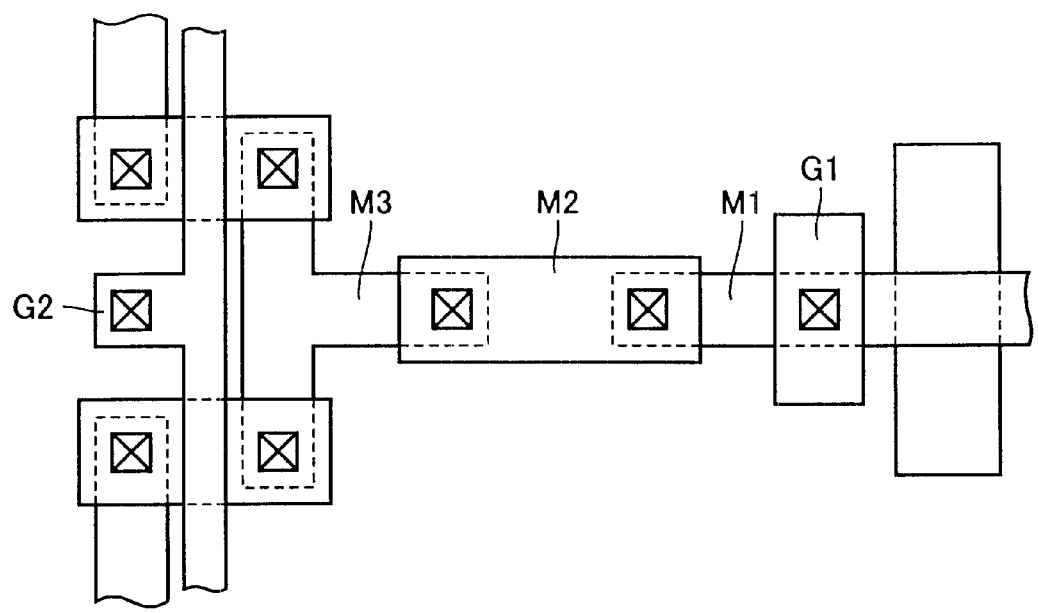
FIG. 10 is a schematic view for illustrating one example of a process in which a plasma damage can be caused.
Figure 11:
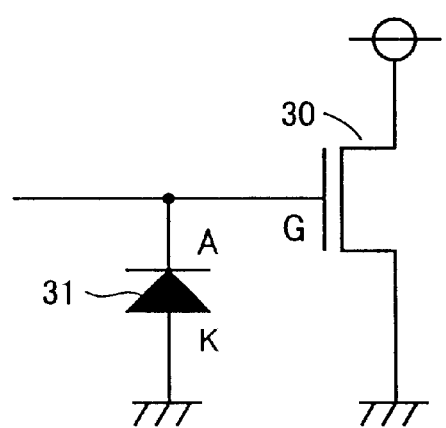
FIG. 11 is an equivalent circuit diagram of a MOS transistor having a protection diode.

The MOS transistor fabrication essentially requires forming an element isolating region, as described previously. As shown in FIG. 9, typically semiconductor substrate 1 has a main surface provided with a plurality of generally parallel, element isolating regions 10. In the present embodiment, gate pattern 3 serving as the first and second conductive layers is provided to traverse the plurality of generally parallel, element isolating regions 10. Then a manner similar to the method as described in the first embodiment is used to provide sidewall film 5 adjacent to a sidewall of gate pattern 3.

Thus, as shown in FIG. 9, in a gate ejecting pattern 21 at a prescribed region there is formed a region sectioned by sidewall film 5 and element isolating region 10. This region receives ions introduced from above to form doped regions 6 of the protection diode.

Using such a method as described above to form the doped region of the protection diode can minimize a pn junction interface in area. Herein, the doped region has its contour defined by the sidewall film and the element isolating region. Typically it is difficult for photolithography to form square, round and any other similar fine dot patterns. For example, photolithography using a KrF laser beam is associated with a limit of resolution corresponding to a pattern of a square of approximately 0.4 µm by 0.4 µm. In contrast, in forming an elongate, quadrate pattern an opening of a pattern of approximately 0.2 µm in width is possible. In the present embodiment this feature is utilized to provide a layout to allow a gate pattern and a plurality of element isolating regions to traverse each other to further minimize the protection diode's junction in area.

While in the first and second embodiments the protection diode is formed in a region enclosed by a rectangular conductive layer for illustration, the conductive layer is not limited to a rectangle and may have any other geometry that encloses the region in which the protection diode is formed.

While in the first to third embodiments the gate pattern is a dummy gate for illustration, it may be a conductive layer formed apart from the gate pattern of the MOS transistor. Furthermore, the process for forming the sidewall film may be separate from the process for fabricating the MOS transistor.

Furthermore, while in the above embodiments the conductive layer is formed exclusively by lithography using a KrF laser beam for illustration, it may be formed by any type of laser beam as the present invention uses a sidewall film for a mask defining in size a doped region of the protection diode when the region is formed by ion implantation.

Furthermore, in the present invention, fabricating the protection diode does not require that the conductive layers be spaced by a distance limited to a dimension of a limit of resolution. In other words, if the conductive layers are spaced by a distance other than the dimension of the limit of resolution it is still possible to provide a doped region smaller than conventional. For example, the conductive layers can be spaced by a distance set to correspond to a dimension slightly larger than the limit of resolution and a sidewall subsequently formed can reduce an exposed opening of a surface of the semiconductor substrate to be smaller than a dimension of a conventional limit of resolution.

Furthermore while the above embodiments do not particularly describe that the conductive layer is electrically floating, it may be floating to reduce capacitance.

Furthermore, the protection diode fabricated in accordance with the present invention can ultimately be connected to an external terminal to allow it to function as an electrostatic discharge (ESD) protection circuit.

It should be noted that if the present invention is applied to an analog device, complementarity needs to be ensured as the device's characteristics and accordingly the protection diode is also strongly required to have characteristics having symmetry. Accordingly, if the present invention is applied the analog device the protection diode is preferably also laid out to have a symmetrical geometry.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a protection diode region for protecting a gate electrode of a field effect transistor formed by a doped region in the protection diode region, formed in a main surface of a semiconductor substrate and a substrate region located in said semiconductor substrate adjacent to said doped region, said doped region being electrically connected to a gate electrode of a field effect transistor formed in another region of said semiconductor substrate, said substrate region being electrically connected to a ground potential, the method comprising the steps of:

forming first and second conductive layers on a main surface of said semiconductor substrate, said first and second conductive layers being spaced from each other;

forming first and second sidewall films adjacent to a sidewall of said first conductive layer opposite said second conductive layer and a sidewall of said second conductive layer opposite said first conductive layer, respectively; and with said first and second conductive layers and said first and second sidewall films used as a mask, implanting a dopant in said semiconductor substrate to form said doped region between the first and second conductive layers.

2. The method according to claim 1, wherein said gate electrode of said field effect transistor and said first and second conductive layers are simultaneously formed.

3. The method according to claim 1, further comprising the step of forming an element isolating region in a main surface of said semiconductor substrate, said element isolating region underlying at least one of said first and second conductive layers.

4. The method according to claim 1, further comprising the step of forming a plurality of element isolating regions in a main surface of said semiconductor substrate to traverse said first and second conductive layers when said semiconductor substrate is seen in a plane, wherein the step of implanting includes using said first and second sidewall films and said element isolating regions as a mask.

5. The method according to claim 1, wherein:

the step of forming said first and second conductive layers includes forming a conductive layer having an opening when said semiconductor substrate is seen in a plane; and the step of forming said first and second sidewall films includes forming a sidewall film adjacent.

* * * * *